(12) United States Patent
Lung

(10) Patent No.: US 7,903,447 B2
(45) Date of Patent: Mar. 8, 2011

(54) METHOD, APPARATUS AND COMPUTER PROGRAM PRODUCT FOR READ BEFORE PROGRAMMING PROCESS ON PROGRAMMABLE RESISTIVE MEMORY CELL

(75) Inventor: Hsiang-Lan Lung, Elmsford, NY (US)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 11/610,293

(22) Filed: Dec. 13, 2006

(65) Prior Publication Data
US 2008/0144353 A1 Jun. 19, 2008

(51) Int. Cl.
G11C 11/00 (2006.01)
G11C 11/36 (2006.01)

(52) U.S. Cl. .......... 365/148; 365/158; 365/163; 365/175

(58) Field of Classification Search .................. 365/148, 365/158, 163, 171, 173, 175
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai et al. | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng | |
| 5,754,472 A | 5/1998 | Sim | |

(Continued)

FOREIGN PATENT DOCUMENTS

WO WO 00/45108 A1 8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner* — Trong Phan
(74) *Attorney, Agent, or Firm* — Haynes Beffel & Wolfeld LLP

(57) ABSTRACT

A method, system and computer program product for programming a plurality of programmable resistive memory cells is disclosed. The method comprises executing the following for each memory cell: reading a resistance of a memory cell and reading input data corresponding to the memory cell. The method further comprises executing the following for each memory cell: programming the memory cell to a lower resistance (SET) state if the resistance is at a higher resistance state and the input data corresponds to a first (SET) state and programming the memory cell to a higher resistance (RESET) state if the resistance is at a lower resistance state and the input data corresponds to a second (RESET) state.

18 Claims, 10 Drawing Sheets

U.S. PATENT DOCUMENTS

| | | | |
|---|---|---|---|
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,625,054 B2 * | 9/2003 | Lowrey et al. | 365/148 |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,768,665 B2 * | 7/2004 | Parkinson et al. | 365/148 |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,830,952 B2 | 12/2004 | Lung et al. | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 * | 8/2005 | Cho et al. | 365/148 |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 * | 5/2006 | Kang | 365/148 |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung | |
| 7,078,273 B2 | 7/2006 | Matsuoka et al. | |
| 7,085,154 B2 | 8/2006 | Cho et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,675 B2 | 11/2006 | Gilton | |
| 7,151,273 B2 | 12/2006 | Campbell et al. | |
| 7,154,774 B2 * | 12/2006 | Bedeschi et al. | 365/148 |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,190,607 B2 | 3/2007 | Cho et al. | |
| 7,202,493 B2 | 4/2007 | Lung et al. | |
| 7,208,751 B2 | 4/2007 | Ooishi et al. | |
| 7,214,958 B2 | 5/2007 | Happ | |
| 7,220,983 B2 | 5/2007 | Lung | |
| 7,229,883 B2 | 6/2007 | Wang et al. | |

| Patent/Pub No. | Date | Inventor |
|---|---|---|
| 7,238,959 B2 | 7/2007 | Chen |
| 7,238,994 B2 | 7/2007 | Chen et al. |
| 7,248,494 B2 * | 7/2007 | Oh et al. ............... 365/148 |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 * | 2/2008 | Osada et al. ............. 365/148 |
| 7,351,648 B2 | 4/2008 | Furukawa et al. |
| 7,359,231 B2 * | 4/2008 | Venkataraman et al. ..... 365/148 |
| 7,364,935 B2 | 4/2008 | Lung et al. |
| 7,365,385 B2 | 4/2008 | Abbott |
| 7,379,328 B2 * | 5/2008 | Osada et al. ............. 365/148 |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,505,330 B2 | 3/2009 | Pawlowski et al. |
| 7,507,986 B2 | 3/2009 | Lung |
| 7,514,334 B2 | 4/2009 | Chen et al. |
| 7,515,461 B2 | 4/2009 | Happ et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0094885 A1 * | 4/2008 | Ho et al. |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |

| | | |
|---|---|---|
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0273968 A1 | 11/2009 | Lamorey et al. |

FOREIGN PATENT DOCUMENTS

| | | |
|---|---|---|
| WO | WO 00/79539 A1 | 12/2000 |
| WO | WO 01/45108 A1 | 6/2001 |
| WO | 0225733 | 3/2002 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

"Optimized Thermal Capacitance in a Phase Change Memory Cell Design," IPCOM000141986D, IP.com Prior Art Database, Oct. 18, 2006, 4pp.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Atwood, G, et al., "90 nm Phase Change Technology with u Trench and Lance Cell Elements," VLSI Technology, Systems and Applications, Apr. 23-25, 2007, pp. 1-2.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Gleixner, "Phase Change Memory Reliability", 22nd NVSMW, Aug. 26, 2007, 46 pages.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

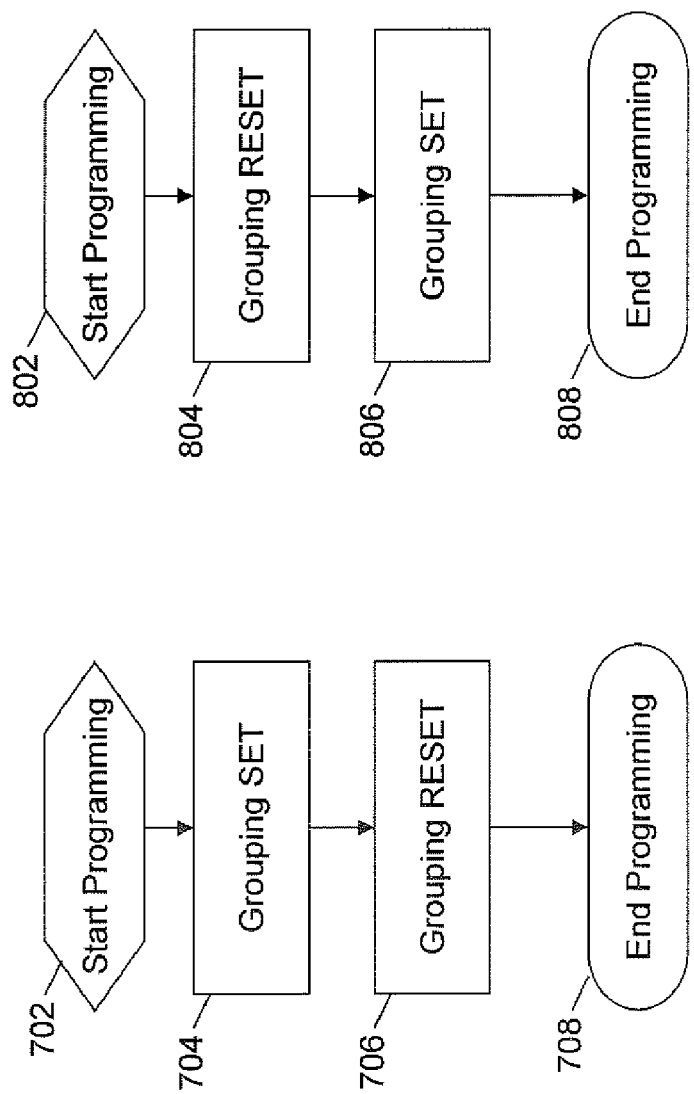

METHOD, APPARATUS AND COMPUTER PROGRAM PRODUCT FOR READ BEFORE PROGRAMMING PROCESS ON PROGRAMMABLE RESISTIVE MEMORY CELL

CROSS-REFERENCE TO OTHER APPLICATIONS

The subject matter of this patent application is related to the subject matter of the following U.S. patent applications of the same inventor: Ser. No. 11/621,431, filed on Jan. 9, 2007, entitled "Method, Apparatus and Computer Program Product for Read Before Programming Process on Multiple Programmable Resistive Memory Cells," and U.S. patent application Ser. No. 11/621,455, filed on Jan. 9, 2007, entitled "Method, Apparatus and Computer Program Product for Stepped Reset Programming Process on Programmable Resistive Memory Cell."

PARTIES TO A JOINT RESEARCH AGREEMENT

International Business Machines Corporation, a New York corporation; Macronix International Corporation, Ltd., a Taiwan corporation, and Infineon Technologies A. G., a German corporation, are parties to a Joint Research Agreement.

BACKGROUND OF THE INVENTION

1. Field of the Invention

The present invention relates to high density memory devices based on memory materials, for example resistor random access memory (RRAM) devices, and to methods for programming such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

In phase change memory, data is stored by causing transitions between amorphous and crystalline states in the phase change material using current. Current heats the material and causes transitions between the states. The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state.

Each memory cell of a phase change memory device is coupled to a bit line and an access device, such as a transistor, wherein the access device is coupled to a word line. The method by which the resistance of a phase change memory cell is read, set or reset involves the application of bias voltages to the bit line and word line for the memory cell. In order to apply a set voltage pulse or a reset voltage pulse to a phase change memory cell, the word and bit lines must be connected to circuitry providing the set voltage pulse or the reset voltage pulse. The creation of these connections for setting or resetting a phase change memory cell is referred to as "bit line set up" and "word line set up." There is a time and resource expenditure associated with the steps taken during bit line setup and word line setup. Therefore, there is a desire to reduce the number of steps taken during bit line setup and word line setup. Furthermore, when handling the programming of successive phase change memory cells in an array of phase change memory cells, word line setup and bit line setup for a first memory cell may necessitate a change if the set/reset programming for a memory cell is different from the set/reset programming of the immediately preceding memory cell. Changing a word line setup or a bit line setup when sequentially programming memory cells also expends time and resources. Therefore, there is a further desire to reduce the number of times a word line setup or a bit line setup is changed when programming successive phase change memory cells in an array of phase change memory cells.

Accordingly, an opportunity arises to devise methods and structures that reduce the steps taken in a bit line setup and a word line setup when programming a phase change memory cell or programming successive phase change memory cells in an array of phase change memory cells.

BRIEF SUMMARY OF THE INVENTION

A first aspect of the present invention relates to a method for programming a plurality of programmable resistive memory cells. One exemplary method comprises executing the following for each memory cell: reading a resistance of a memory cell and reading input data corresponding to the memory cell. The method further comprises executing the following for each memory cell: programming the memory cell to a lower resistance (SET) state if the resistance is at a higher resistance state and the input data corresponds to a first (SET) state, and programming the memory cell to a higher resistance (RESET) state if the resistance is at a lower resistance state and the input data corresponds to a second (RESET) state.

A second aspect of the present invention relates to a programmable resistive memory system that in one example comprises a memory cell device comprising a plurality of programmable resistive memory cells and a controller for programming the memory cell device. The controller is configured for executing the following for each memory cell: reading a resistance of a memory cell and reading input data corresponding to the memory cell. The controller is further configured for executing the following for each memory cell: programming the memory cell to a lower resistance (SET) state if the resistance is at a higher resistance state and the input data corresponds to a first (SET) state and programming the memory cell to a higher resistance (RESET) state if the resistance is at a lower resistance state and the input data corresponds to a second (RESET) state.

A third aspect of the present invention relates to a computer program product including computer instructions for programming a memory cell device event in one example comprises a plurality of programmable resistive memory cells. The computer instructions include instructions for executing the following for each memory cell: reading a resistance of a memory cell and reading input data corresponding to the memory cell. The computer instructions further include instructions for executing the following for each memory cell: programming the memory cell to a lower resistance (SET) state if the resistance is at a higher resistance state and the input data corresponds to a first (SET) state and programming the memory cell to a higher resistance (RESET) state if the resistance is at a lower resistance state and the input data corresponds to a second (RESET) state.

Various features and advantages of the invention will appear from the following description in which the preferred embodiments have been set forth in detail in conjunction with the accompanying drawings.

BRIEF DESCRIPTION OF THE DRAWINGS

FIG. 7 is a flowchart showing the control flow of the process for group programming of a plurality of memory cells comprising a phase change material, in accordance with one embodiment of the present invention.

FIG. 8 is a flowchart showing the control flow of the process for group programming of a plurality of memory cells comprising a phase change material, in accordance with another embodiment of the present invention.

DETAILED DESCRIPTION OF THE INVENTION

Figure 1:
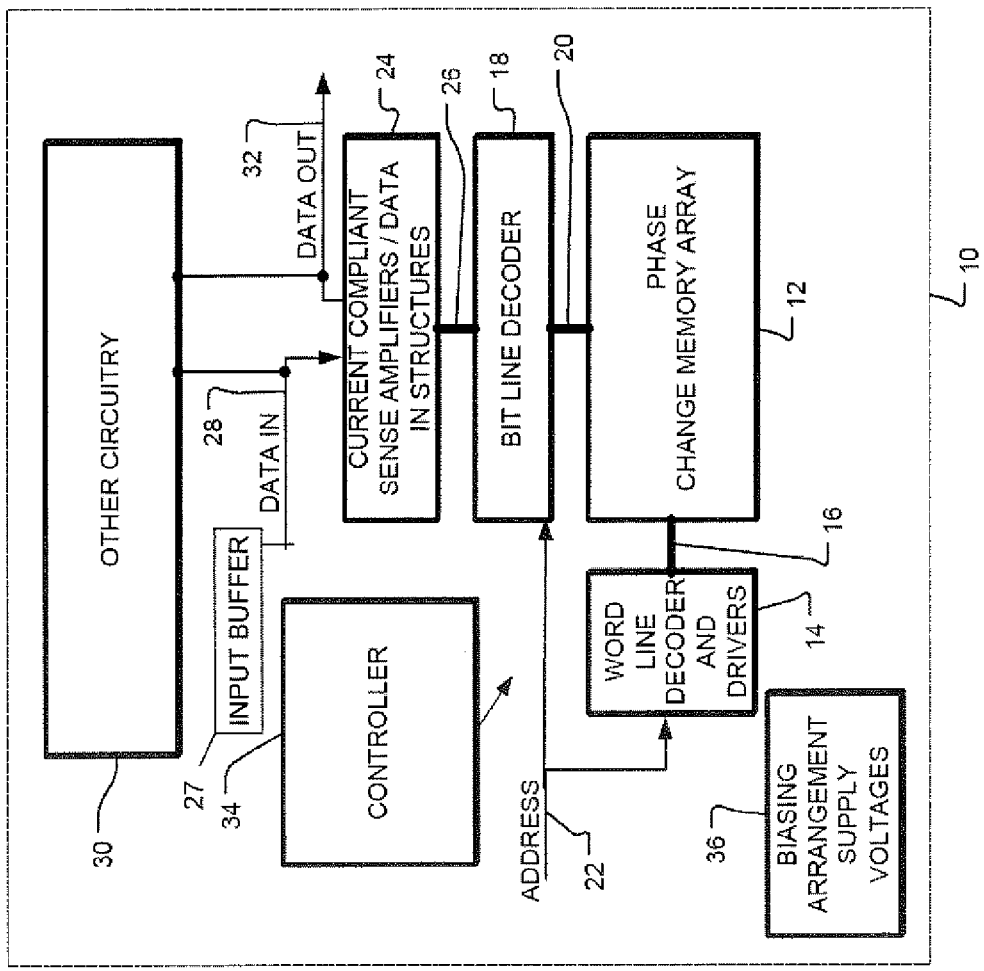
FIG. 1 is a block diagram of an integrated circuit device in accordance with the present invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Referring to FIG. 1, shown is a simplified block diagram of an integrated circuit 10 in which the present invention may be implemented. Circuit 10 includes a memory array 12 implemented using phase change memory cells (not shown) on a semiconductor substrate, discussed more fully below. A word line decoder 14 is in electrical communication with a plurality of word lines 16. A bit line decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied from an input buffer 27 via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
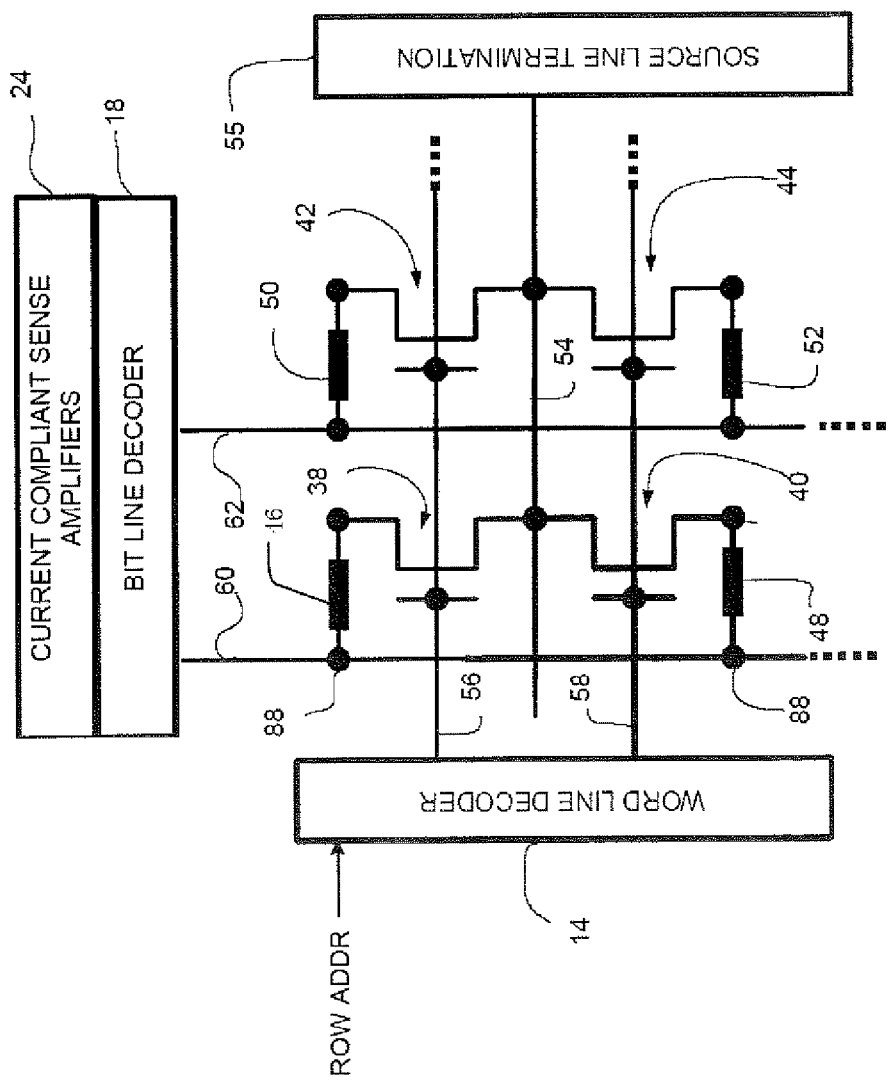
FIG. 2 is a partial schematic diagram of a representative memory array as shown in FIG. 1.

As shown in FIG. 2 each of the memory cells of array 12 includes an access transistor (or other access device such as a diode), four of which are shown as 38, 40, 42 and 44, and a memory element, typically a phase change element, shown as 46, 48, 50 and 52. Sources of each of access transistors 38, 40, 42 and 44 are connected in common to a source line 54 that terminates in a source line termination 55. In another embodiment the source lines of the select devices are not electrically connected, but independently controllable. A plurality 16 of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60 via separate connections 88. Specifically, phase change element 46 is connected between the drain of access transistor 38 and bit line 60, and phase change element 48 is connected between the drain of access transistor 40 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other ray structures may be used, e.g. the phase change memory element is connected to source.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell device 10 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 16 that changes phase is small; and accordingly, the magnitude of the reset current required for changing the phase is very small.

Embodiments of memory cell device 10 include phase change based memory materials, including chalcogenide based materials and other materials, for memory element 16. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

The following are short summaries describing four types of resistive memory materials.

1. Chalcogenide Material $Ge_xSb_yTe_z$ x:y:z=2:2:5

Or other compositions with x: 0~5; y: 0~5; z: 0~10

GeSbTe with doping, such as N—, Si—, Ti—, or other element doping may also be used.

Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material $Pr_xCa_yMnO_3$

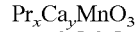

Or other compositions with x: 0~1; y: 0~1

Another CMR material that includes Mn oxide may be used

Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound

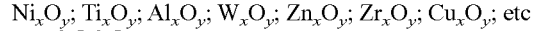

x:y=0.5:0.5

Other compositions with x: 0~1; y: 0~1

Formation method:

A. Deposition: By PVD sputtering or magnetron-sputtering method with reactive gases of Ar, $N_2$, $O_2$, and/or He, etc. at the pressure of 1 mtorr 100 mtorr, using a target of metal oxide, such as $Ni_xO_y$; $Ti_xO_y$; $Al_xO_y$; $W_xO_y$; $Zn_xO_y$; $Zr_xO_y$; $C_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.

B. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.

C. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

A. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

B. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

Figure 3:
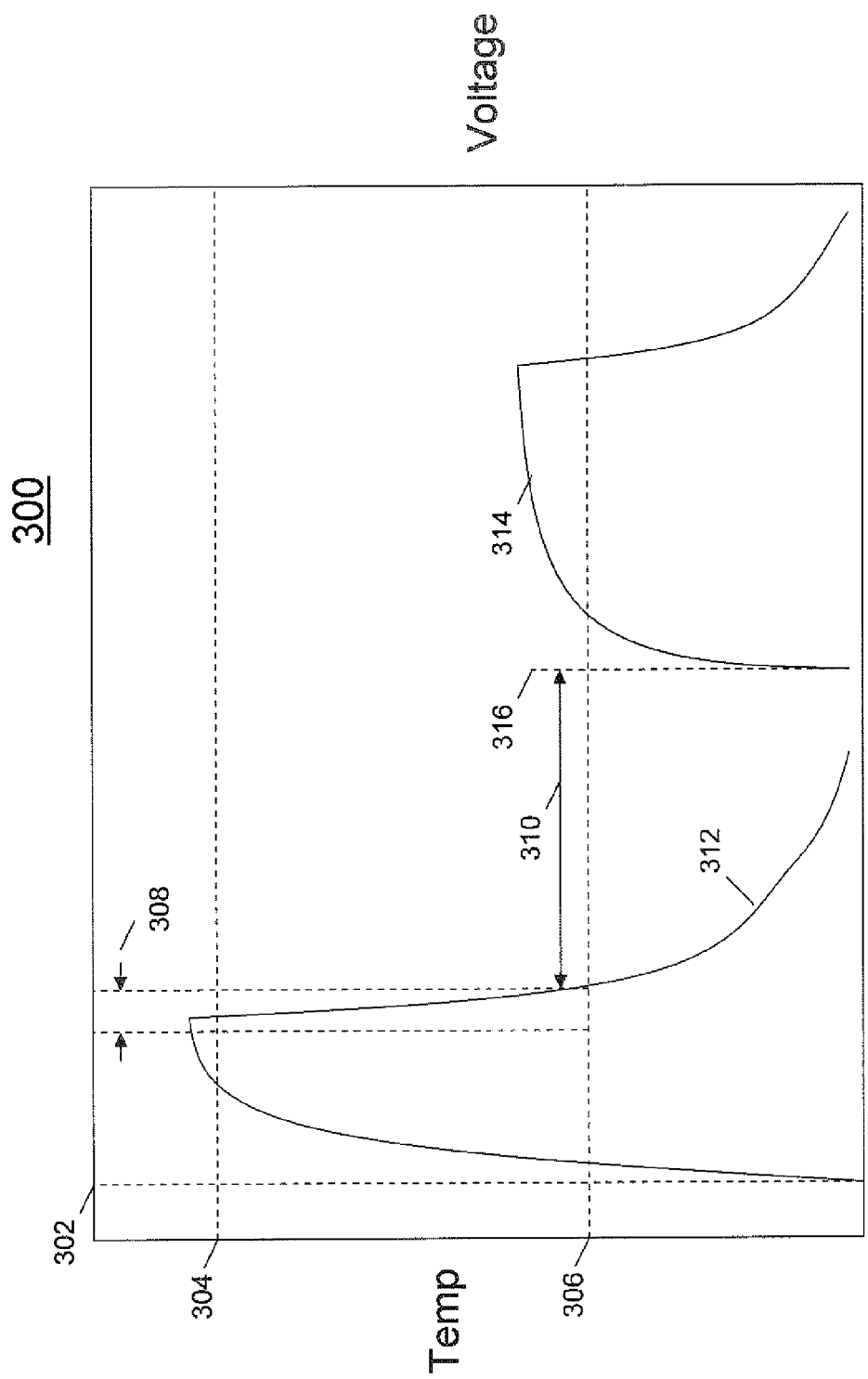
FIG. 3 is a graph of voltage and temperature versus time for pulses used for programming programmable resistive memory cells, according to one embodiment of the present invention.

FIG. 3 is a graph 300 of voltage and temperature versus time for pulses used for programming programmable resistive memory cells, according to one embodiment of the present invention. As explained above, in phase change memory, data is stored by causing transitions between amorphous and crystalline states in the phase change material using current. Current heats the phase change material and causes transitions between the states. FIG. 3 describes the electrical pulses used to cause the transitions. Specifically, FIG. 3 describes the bias voltages that are applied to bit lines and word lines of a memory cell. The y-axis of graph 300 indicates the magnitude of the bias voltage applied to a phase change material, as well as the temperature to which the phase change material is heated by each pulse. The x-axis of graph 300 indicates the passage of time as the voltage applied to a phase change material and as the temperature of the phase change material increases and decrease over time.

Line 302 indicates the beginning of a RESET pulse 312, which converts a phase change material into an amorphous, high resistance state. The change from crystalline to amorphous, referred to as reset herein, is generally a higher current operation, which includes a short high current density pulse to melt the crystalline structure, after which the phase change material cools quickly, quenching the phase change process, allowing at least a portion of the phase change structure to stabilize in the amorphous state. Line 304 indicates the temperature at which the phase change material transforms into an amorphous state. Note that pulse 312 increases the temperature past line 304. The quenching phase is indicated by the set of lines 308, wherein the phase change process that transforms the phase change material from crystalline to amorphous is quenched or supplied with the appropriate energy.

Line 316 indicates the beginning of a SET pulse 314, which converts a phase change material into a crystalline, low resistance state. The change from the amorphous to the crystalline state is generally a longer pulse but a lower current operation. Line 306 indicates the temperature at which the phase change material transforms into a crystalline state, sometimes called a breakdown transformation, which is lower than the temperature for a amorphous state, indicated by line 304. Note that pulse 314 increases the temperature past line 304. Also shown is interim 310, which indicates the wait time that must be tolled between the activation of SET pulse 314 after the RESET pulse 312 completes the quench process. Line 306 corresponds to the threshold voltage of the phase change elements 46-52, discussed in more detail below, above which the bit line voltage is set to achieve set pulse 314.

Figure 4:
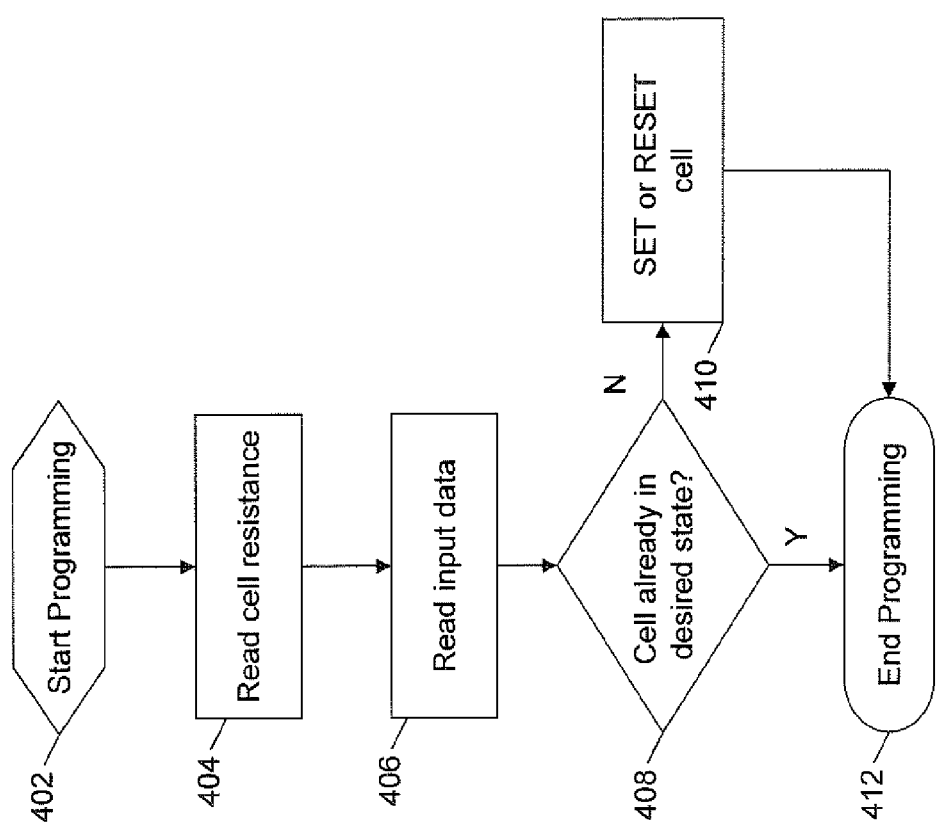
FIG. 4 is a flowchart showing the control flow of a general process for programming a single memory cell comprising a phase change material, in accordance with one embodiment of the present invention.

FIG. 4 is a flowchart showing the control flow of a general process for programming a single memory cell comprising a phase change material, in accordance with one embodiment of the present invention. Specifically, the flowchart of FIG. 4 describes that process that takes place when a controller, such as controller 34, programs (that is, sets or resets) a single memory cell of a phase change memory device comprising a plurality of memory cells. FIG. 4 begins with step 402 and proceeds directly to step 404. In step 404, the resistance of the memory cell is read. In step 406, input data, representing the data that must be reflected by the state of the memory cell, is read. In step 408, it is determined whether the resistance of the memory cell is in a state that reflects the input data. For example, if the resistance of the memory cell is high and the input data indicates a "0," or if the memory cell is low and the input data indicates a "1," then the resistance of the memory cell is in a state that reflects the input data. Otherwise, the resistance of the memory cell is not in a state that reflects the input data.

If the result of step 408 is positive, then control flows to step 410. If the result of step 408 is negative, then control flows to step 412. In step 412, the memory cell is either set or reset, depending on the programming process that is taking place. In step 410, the programming process of the flowchart of FIG. 4 ends.

Figure 5:
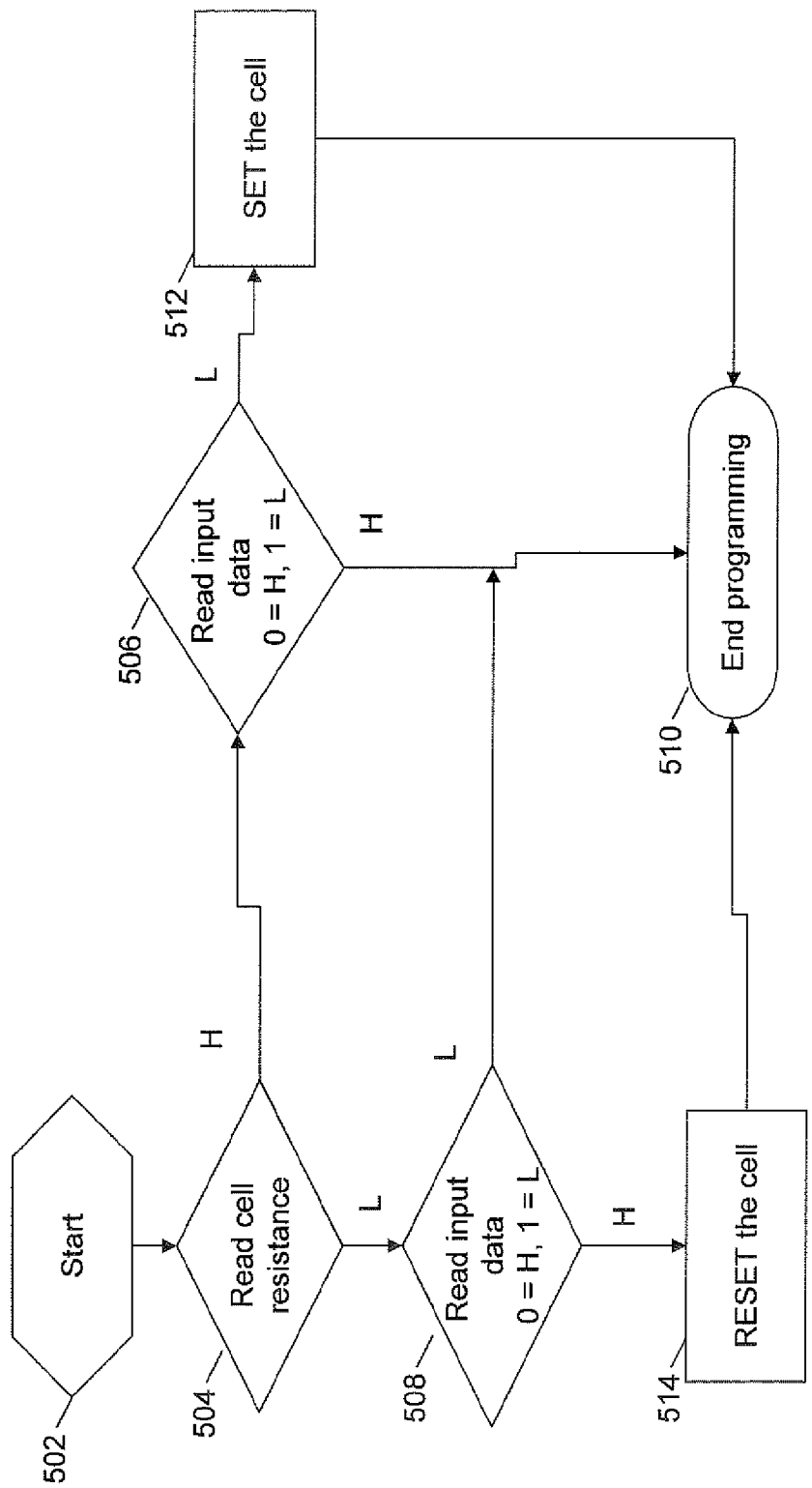
FIG. 5 is a flowchart showing the control flow of the process for programming a single memory cell comprising a phase change material, in accordance with one embodiment of the present invention.

FIG. 5 is a flowchart showing the control flow of the process for programming a single memory cell comprising a phase change material, in accordance with one embodiment of the present invention. Specifically, the flowchart of FIG. 5 describes that process that takes place when a controller, such as controller 34, programs (that is, sets or resets) a single memory cell of a phase change memory device comprising a plurality of memory cells. FIG. 5 provides more detail for the general process described by the flowchart of FIG. 4.

FIG. 5 begins with step 502 and proceeds directly to step 504. In step 504, the resistance of a memory cell at an address is read. In one embodiment of the present invention, the reading step comprises applying a voltage to a bit line coupled to the memory cell and applying a voltage to a word line coupled to an access device, the access device being coupled to the memory cell. If the result of step 504 is that a high resistance is read, indicating the memory cell is in an at least partial amorphous state, then control flows to step 506. If the result of step 504 is that a low resistance is read, indicating the memory cell is in a crystalline state, then control flows to step 508.

In step 506, input data, representing the data that must be reflected by the state of the memory cell, is read. In one embodiment of the present invention, this reading step comprises receiving input data, such as from an input buffer, and evaluating a value of the input data. The input data can be, for example, a single bit value indicating a "0" or a "1." If the result of step 506 is that a first bit value is read, indicating a "0," then control flows to step 510. If the result of step 504 is that a second bit value is read, indicating a "1," then control flows to step 512.

In step 512, the memory cell is set. In an embodiment of the present invention, the step of setting the memory cell comprises applying bias voltages to the bit line and the word line of the memory cell so as to change the memory cell to a crystalline, low resistance state. This step takes place using a lower current via the bit line. This is described in greater detail above with reference to FIG. 3.

In step 508, input data, representing the data that must be reflected by the state of the memory cell, is read. If the result of step 508 is that a first bit value is read, indicating a "0," then control flows to step 514. If the result of step 508 is that a second bit value is read, indicating a "1," then control flows to step 510.

In step 514, the memory cell is reset. In an embodiment of the present invention, the step of resetting the memory cell comprises applying bias voltages to the bit line and the word line of the memory cell so as to change the memory cell to an amorphous, high resistance state. This is described in greater detail above with reference to FIG. 3. In step 510, the programming process of the flowchart of FIG. 5 ends.

Figure 6:
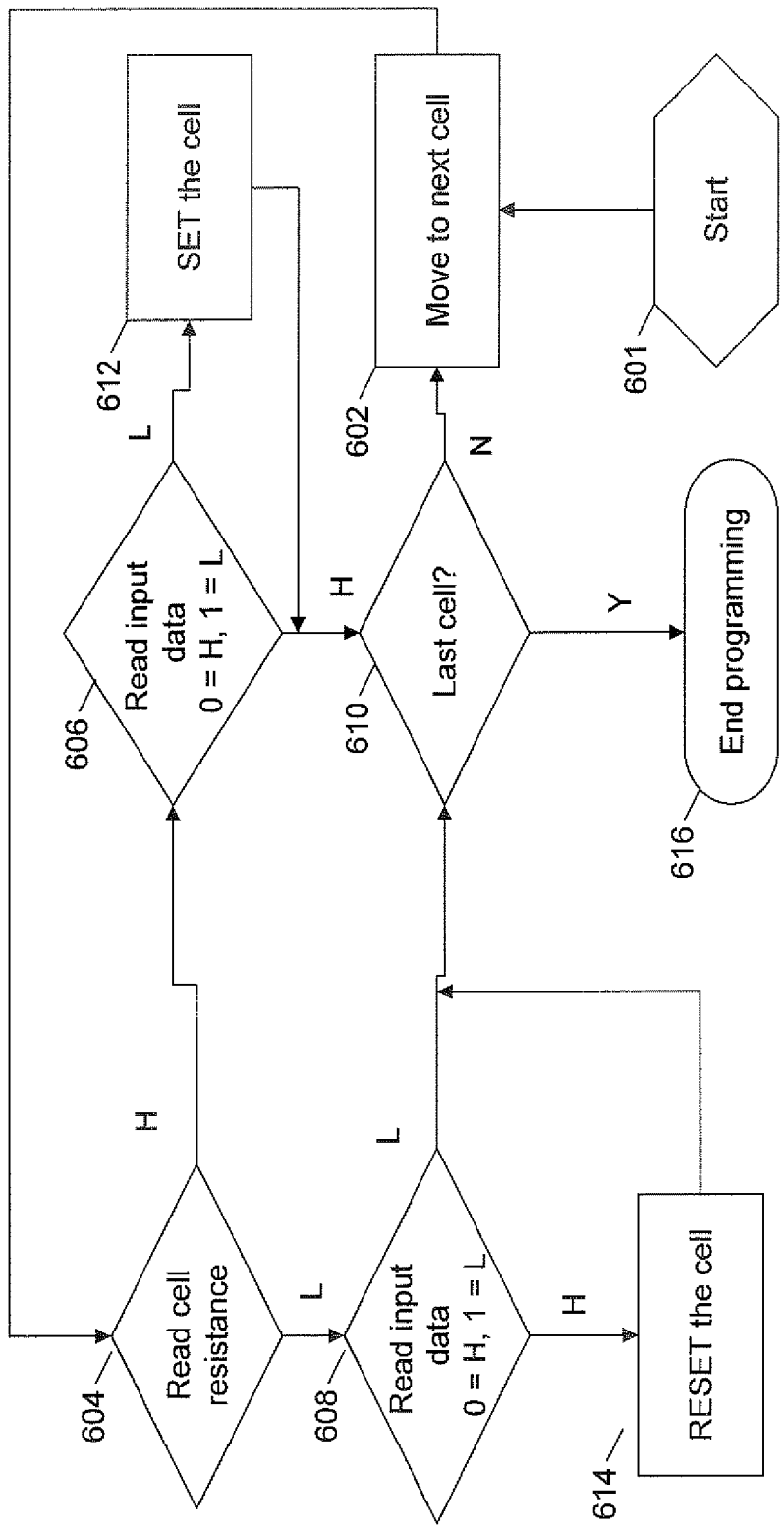
FIG. 6 is a flowchart showing the control flow of the process for sequentially programming a plurality of memory cells comprising a phase change material, in accordance with one embodiment of the present invention.

FIG. 6 is a flowchart showing the control flow of the process for sequentially programming a plurality of memory cells comprising a phase change material, in accordance with one embodiment of the present invention. Specifically, the flowchart of FIG. 6 describes that process that takes place when a controller, such as controller 34, sequentially programs (that is, sets or resets) a plurality of memory cells of a phase change memory device. The process of FIG. 6 is the extension of the process of FIG. 5 to a plurality of memory cells.

FIG. 6 begins with step 601 and proceeds directly to step 602. In step 602, the programming sequence moves to the next available memory cell that is slated for programming in a plurality of memory cells that will be programmed. In step 604, the resistance of a memory cell at an address is read. If the result of step 604 is that a high resistance is read, indicating the memory cell is in an at least partial amorphous state, then control flows to step 606. If the result of step 604 is that a low resistance is read, indicating the memory cell is in a crystalline state, then control flows to step 608.

In step 606, input data, representing the data that must be reflected by the state of the memory cell, is read. In one embodiment of the present invention, this reading step comprises receiving input data, such as from the input buffer, and evaluating a value of the input data. The input data can be, for example, a single bit value indicating a "0" or a "1." If the result of step 606 is that a first bit value is read, indicating a "0," then control flows to step 610. If the result of step 604 is that a second bit value is read, indicating a "1," then control flows to step 612.

In step 612, the memory cell is set. In step 608, input data, representing the data that must be reflected by the state of the memory cell, is read. If the result of step 608 is that a first bit value is read, indicating a "0," then control flows to step 614. If the result of step 608 is that a second bit value is read, indicating a "1," then control flows to step 610.

In step 614, the memory cell is reset. In step 610, it is determined whether there are any additional memory cells that are slated for programming in a plurality of memory cells that will be programmed. If the result of step 610 is negative, then control flows to step 616. If the result of step 610 is positive, then control flows to step 602, where the process of the flowchart of FIG. 6 continues until all memory cells slated for programming have been programmed. In step 616, the programming process of the flowchart of FIG. 6 ends.

FIG. 7 is a flowchart showing the control flow of the process for group programming of a plurality of memory cells comprising a phase change material, in accordance with one embodiment of the present invention. Specifically, the flowchart of FIG. 7 describes that process that takes place when a controller, such as controller 34, programs (that is, sets or resets) a plurality of memory cells of a phase change memory device using a grouping method.

FIG. 7 begins with step 702 and proceeds directly to step 704. In step 704, the controller initiates a group set method wherein a set function is sequentially applied to each memory cell in a group of memory cells. The group set method is described in greater detail below with reference to FIG. 9. In step 706, the controller initiates a group reset method wherein a reset function is sequentially applied to each memory cell in the group of memory cells. The group reset method is described in greater detail below with reference to FIG. 10. In step 708, the process of the flowchart of FIG. 7 ends.

FIG. 8 is a flowchart showing the control flow of the process for group programming of a plurality of memory cells comprising a phase change material, in accordance with another embodiment of the present invention. Like the flowchart of FIG. 7, the flowchart of FIG. 8 describes that process that takes place when a controller, such as controller 34, programs (that is, sets or resets) a plurality of memory cells of a phase change memory device using a grouping method. FIG. 8 begins with step 802 and proceeds directly to step 804. In step 804, the controller initiates a group reset method wherein a reset function is sequentially applied to each memory cell in a group of memory cells. The group reset method is described in greater detail below with reference to FIG. 10. In step 806, the controller initiates a group set method wherein a set function is sequentially applied to each memory cell in the group of memory cells. The group set method is described in greater detail below with reference to FIG. 9. In step 808, the process of the flowchart of FIG. 8 ends.

Figure 9:
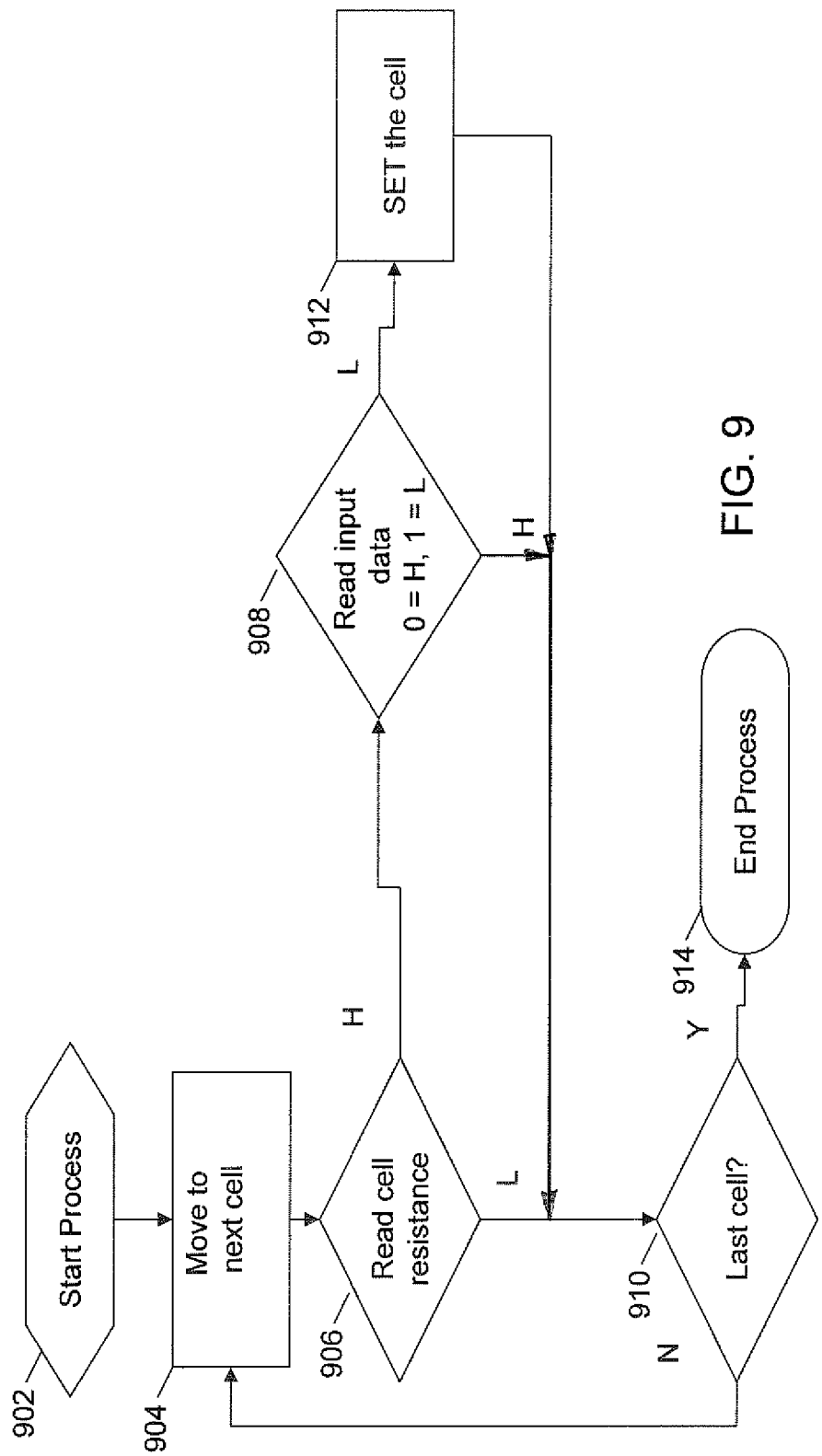
FIG. 9 is a flowchart showing the control flow of the group set process for programming a plurality of memory cells comprising a phase change material, in accordance with one embodiment of the present invention.

FIG. 9 is a flowchart showing the control flow of the group set process for programming a plurality of memory cells comprising a phase change material, in accordance with one embodiment of the present invention. Specifically, the flowchart of FIG. 9 describes that process that takes place when a controller, such as controller 34, sequentially applies a set process to a group of memory cells in a phase change memory device. FIG. 9 begins with step 902 and proceeds directly to step 904. In step 904, the programming sequence moves to the next available memory cell in the group of memory cells to which the group set method is being applied.

In step 906, the resistance of a memory cell at an address is read. If the result of step 906 is that a high resistance is read, indicating the memory cell is in an at least partial amorphous state, then control flows to step 908. If the result of step 906 is that a low resistance is read, indicating the memory cell is in a crystalline state, then control flows to step 910.

In step 908, input data, representing the data that must be reflected by the state of the memory cell, is read. The input data can be, for example, a single bit value indicating a "0" or a "1." If the result of step 908 is that a first bit value is read, indicating a "0," then control flows to step 910. If the result of step 908 is that a second bit value is read, indicating a "1," then control flows to step 912. In step 912, the memory cell is set.

In step 910, it is determined whether the current memory cell is the last memory cell in the group of memory cells to which the group set method is being applied. If the result of step 910 is negative, then control flows to step 904, where the process of the flowchart of FIG. 9 continues until all memory cells in the group have experienced the group set method. If the result of step 910 is positive, then control flows to step 914, where the group set process of the flowchart of FIG. 9 ends.

Figure 10:
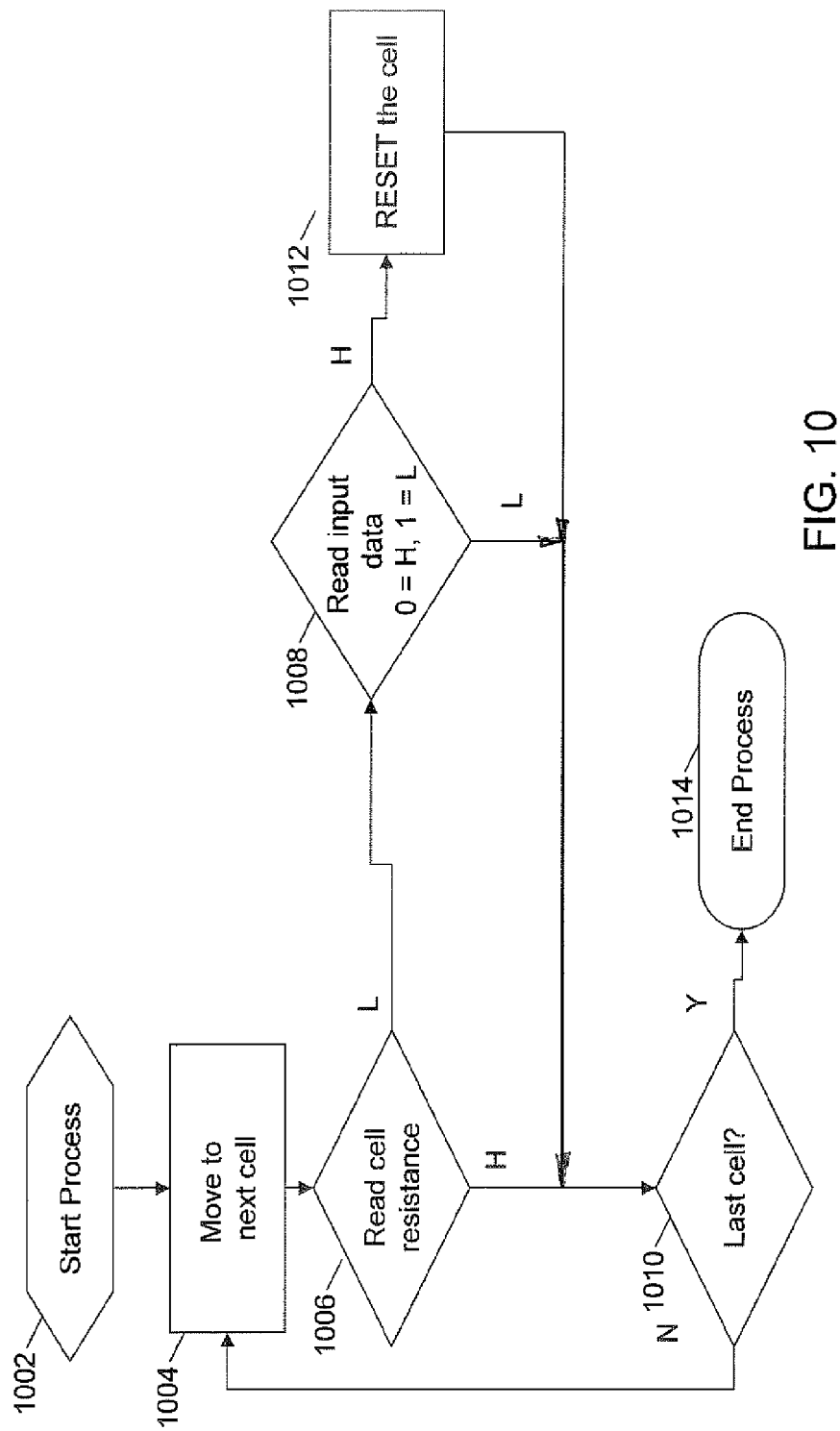
FIG. 10 is a flowchart showing the control flow of the group reset process for programming a plurality of memory cells comprising a phase change material, in accordance with one embodiment of the present invention.

FIG. 10 is a flowchart showing the control flow of the group reset process for programming a plurality of memory cells comprising a phase change material, in accordance with one embodiment of the present invention Specifically, the flowchart of FIG. 10 describes that process that takes place when a controller, such as controller 34, sequentially applies a reset method to a group of memory cells in a phase change memory device. FIG. 10 begins with step 1002 and proceeds directly to step 1004. In step 1004, the programming sequence moves to the next available memory cell in the group of memory cells to which the group reset process is being applied.

In step 1006, the resistance of a memory cell at an address is read. If the result of step 1006 is that a high resistance is read, indicating the memory cell is in an at least partial amorphous state, then control flows to step 1010. If the result of step 1006 is that a low resistance is read, indicating the memory cell is in a crystalline state, then control flows to step 1008.

In step 1008, input data, representing the data that must be reflected by the state of the memory cell, is read. The input data can be, for example, a single bit value indicating a "0" or a "1." If the result of step 1008 is that a first bit value is read, indicating a "0," then control flows to step 1012. If the result of step 1008 is that a second bit value is read, indicating a "1," then control flows to step 1010. In step 1012, the memory cell is reset.

In step 1010, it is determined whether the current memory cell is the last memory cell in the group of memory cells to which the group reset method is being applied. If the result of step 1010 is negative, then control flows to step 1004, where the process of the flowchart of FIG. 10 continues until all memory cells in the group have experienced the group reset method. If the result of step 1010 is positive, then control flows to step 1014, where the group reset process of the flowchart of FIG. 10 ends.

Figure 11:
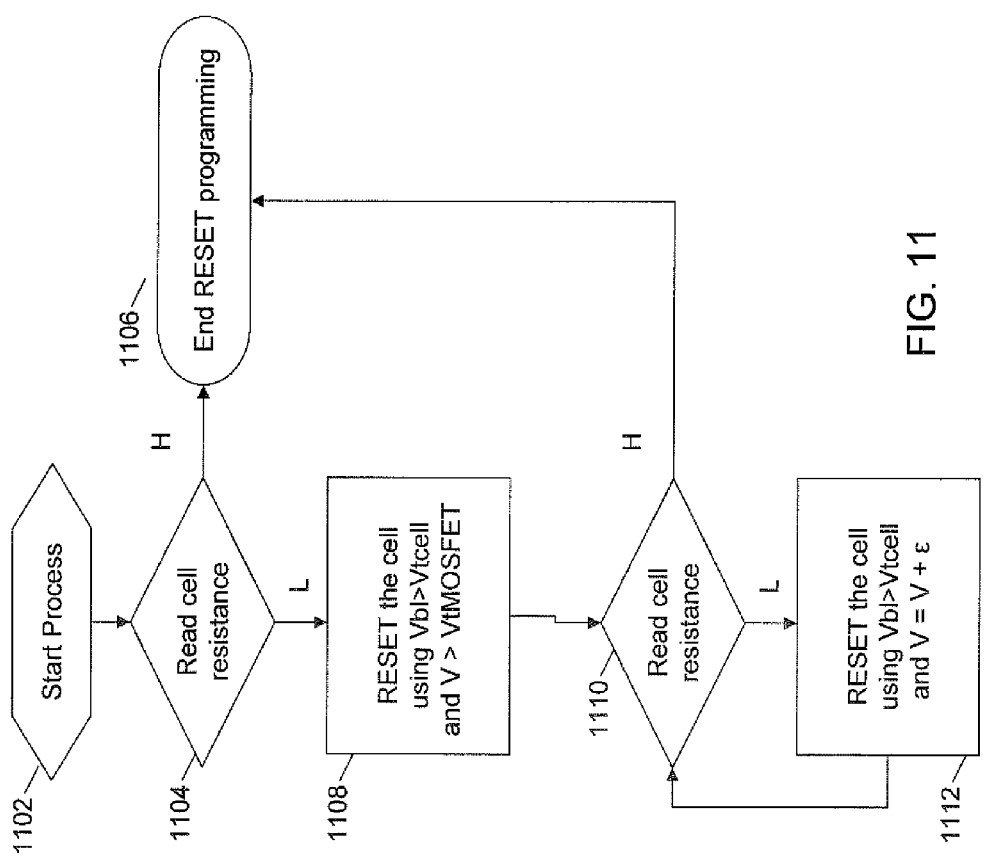
FIG. 11 is a flowchart showing the control flow of the process for reset programming a memory cell comprising a phase change material, in accordance with one embodiment of the present invention.

FIG. 11 is a flowchart showing the control flow of the process for reset programming a memory cell comprising a phase change material, in accordance with one embodiment of the present invention. Specifically, the flowchart of FIG. 11 describes that process that takes place when a controller, such as controller 34, reset programs a memory cell of a phase change memory device comprising a plurality of memory cells.

FIG. 11 begins with step 1102 and proceeds directly to step 1104. In step 1104, the resistance of a memory cell at an address is read. In one embodiment of the present invention, the reading step may comprise applying a voltage to a word line coupled to an access device, such as a pair of MOSFETs, the access device being coupled to the memory cell. The access device further has a threshold voltage (referred to as "VtMOSFET" in FIG. 11).

If the result of step 1104 is that a high resistance is read, indicating the memory cell is in an at least partial amorphous state, then control flows to step 1106. If the result of step 1104 is that a low resistance is read, indicating the memory cell is in a crystalline state, then control flows to step 1108. In step 1106, the reset programming process ends. In step 1108, the memory cell is reset. In an embodiment of the present invention, the step of resetting the memory cell comprises applying bias voltages to the bit line and the word line of the memory cell so as to change the memory cell to an amorphous, high resistance state. This step takes place using a higher current, which includes a short high current density pulse to melt the crystalline structure into an amorphous state. Specifically, the voltage applied to the bit line (referred to as "Vbl" in FIG. 11) is greater than the threshold voltage of the memory element (referred to as "Vtcell" in FIG. 11) and the voltage V applied to the word line is greater than the access device threshold voltage.

In step 1110, the resistance of the memory cell is read again, as described for step 1104 above. If the result of step 1110 is that a high resistance is read, then control flows to step 1106. If the result of step 1110 is that a low resistance is read, then control flows to step 1112. In step 1112, the memory cell is reset once more. In this step, the voltage V is increased by an amount (referred to as "ε" in FIG. 11) and then a voltage greater than the memory element threshold voltage is applied to the bit line and the increased voltage V is applied to the word line. Control then flows back to step 1110 where the process of checking the resistance of the memory cell (step 1110), increasing the word line voltage V (step 1112) and applying the voltage V to the word line (step 1112) is executed until the resistance of the memory cell is high, indicating an amorphous state of the memory cell.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. Any and all patents, patent applications and printed publications referred to above are hereby incorporated by reference.

What is claimed is:

1. A method for programming a plurality of programmable resistive memory cells, comprising:
   executing the following for each memory cell:
     first:
       (a) reading a resistance of a memory cell prior to programming the memory cell; and
       (b) reading input data corresponding to the memory cell; and
     second:
       (c) programming the memory cell to a lower resistance state only if the resistance is at a higher resistance state and the input data corresponds to a first state; and
       (d) following the (c) programming step, programming the memory cell to a higher resistance state only if the resistance is at a lower resistance state and the input data corresponds to a second state.

2. The method according to claim 1 wherein the (a) reading step comprises reading the resistance of the memory cell at an address by applying a voltage to a bit line coupled to the memory cell and applying a voltage to a word line coupled to an access device, the access device being coupled to the memory cell.

3. The method according to claim 2 wherein the (b) reading step further comprises reading input data from an input buffer and evaluating a value of the input data.

4. The method according to claim 3 wherein the (c) programming step further comprises applying bias voltages to the bit line and the word line so as to change the memory cell to a generally crystalline, low resistance state.

5. The method according to claim 4 wherein the (d) programming step further comprises applying bias voltages to the bit line and the word line so as to change the memory cell to a generally amorphous, high resistance state.

6. A programmable resistive memory system, comprising:
   a memory cell device comprising a plurality of programmable resistive memory cells; and
   a controller for programming the memory cell device, the controller configured for executing the following for each memory cell:
     first:
       (a) reading a resistance of a memory cell prior to programming the memory cell; and
       (b) reading input data corresponding to the memory cell; and
     second:
       (c) programming the memory cell to a lower resistance state only if the resistance is at a higher resistance state and the input data corresponds to a first state; and
       (d) following the (c) programming step, programming the memory cell to a higher resistance state only if the resistance is at a lower resistance state and the input data corresponds to a second state.

7. The programmable resistive memory system according to claim 6 wherein each memory cell comprises phase change materials.

8. The programmable resistive memory system according to claim 7 wherein the phase change material comprises GST.

9. The programmable resistive memory system according to claim 6 wherein each memory cell is coupled to a bit line and an access device and wherein the access device is coupled to a word line.

10. The programmable resistive memory system according to claim 9 wherein the controller is conductively coupled with the bit line and the word line for each memory cell.

11. The programmable resistive memory system according to claim 10 wherein the controller comprises an energy source for applying bias voltages to the bit line and the word line for each memory cell.

12. A computer program product including computer instructions for programming a memory cell device comprising a plurality of programmable resistive memory cells, the computer instructions including instructions for executing the following for each memory cell:
   first:
     (a) reading a resistance of a memory cell prior to programming the memory cell; and
     (b) reading input data corresponding to the memory cell; and
   second:
     (c) programming the memory cell to a lower resistance state only if the resistance is at a higher resistance state and the input data corresponds to a first state; and
     (d) following the (c) programming step, programming the memory cell to a higher resistance state only if the resistance is at a lower resistance state and the input data corresponds to a second state.

13. The computer program product according to claim 12, wherein the (a) reading step comprises reading the resistance of the memory cell at an address by applying a voltage to a bit line coupled to the memory cell and applying a voltage to a word line coupled to an access device, the access device being coupled to the memory cell.

14. The computer program product according to claim 13 wherein the (b) reading step comprises receiving input data from an input buffer and evaluating a value of the input data.

15. The computer program product according to claim 14 wherein the (c) programming step further comprises applying bias voltages to the bit line and the word line so as to change the memory cell to a crystalline, low resistance state.

16. The computer program product according to claim 15 wherein the (d) programming step further comprises applying bias voltages to the bit line and the word line so as to change the memory cell to an amorphous, high resistance state.

17. A method for group programming of a plurality of programmable resistive memory cells, comprising:
   (1) executing the following for each memory cell:
      first:
         (a) reading a resistance of a memory cell prior to programming the memory cell; and
         (b) reading input data corresponding to the memory cell; and
      second:
         (c) programming the memory cell to a lower resistance state only if the resistance is at a higher resistance state and the input data corresponds to a first state; and
   (2) executing the following for each memory cell:
      first:
         (a) reading a resistance of a memory cell prior to programming the memory cell; and
         (b) reading input data corresponding to the memory cell; and
      second:
         (c) programming the memory cell to a higher resistance state only if the resistance is at a lower resistance state and the input data corresponds to a second state.

18. The method according to claim 17 wherein the (1) executing step is carried out before the (2) executing step.

* * * * *